United States Patent [19]

Ikeda et al.

[11] Patent Number: 5,656,113
[45] Date of Patent: Aug. 12, 1997

[54] METHOD OF MANUFACTURING A MULTILAYERED WIRING SUBSTRATE OF ALUMINUM NITRIDE HAVING A HIGH DIELECTRIC LAYER

[75] Inventors: Tatsuya Ikeda, Kasugai; Atsushi Kanda, Konan, both of Japan

[73] Assignee: NGK Spark Plug Co., Ltd., Nagoya, Japan

[21] Appl. No.: 492,441

[22] Filed: Jun. 19, 1995

Related U.S. Application Data

[62] Division of Ser. No. 285,294, Aug. 3, 1994.

[30] Foreign Application Priority Data

Aug. 3, 1993 [JP] Japan .................. 5-192373

[51] Int. Cl.⁶ ............................... B32B 31/26
[52] U.S. Cl. ............................ 156/89; 156/252
[58] Field of Search ............. 156/89, 252, 277, 156/381; 264/61, 63, 65; 361/311, 313, 321.1, 321.5; 174/260; 501/96

[56] References Cited

U.S. PATENT DOCUMENTS

| | | |
|---|---|---|
| 4,733,328 | 3/1988 | Blazej . |
| 4,770,953 | 9/1988 | Horiguchi et al. ............ 501/96 X |
| 4,950,435 | 8/1990 | Taniguchi et al. ............ 264/65 |
| 5,099,388 | 3/1992 | Ogawa et al. . |

FOREIGN PATENT DOCUMENTS

| | | |
|---|---|---|
| 59-82753 | 5/1984 | Japan . |
| 59-148395 | 8/1984 | Japan . |
| 61-100901 | 5/1986 | Japan . |
| 63-156075 | 6/1988 | Japan . |
| 2270396 | 11/1990 | Japan . |
| 387091 | 4/1991 | Japan . |
| 3191596 | 8/1991 | Japan . |
| 4285073 | 10/1992 | Japan . |
| 5-58744 | 3/1993 | Japan . |

*Primary Examiner*—David A. Simmons
*Assistant Examiner*—M. Curtis Mayes
*Attorney, Agent, or Firm*—Sughrue, Mion, Zinn, Macpeak & Seas

[57] ABSTRACT

An aluminum nitride multilayered wiring substrate and a method of manufacturing the wiring substrate are provided. The wiring substrate is provided with the high dielectric layer. Although the wiring substrate has no excessively multilayered structure, high capacitance can be easily obtained. The multilayered wiring substrate is a laminated body of an upper substrate layer, a capacitor layer and a lower substrate layer. Three aluminum nitride Layers composing the upper substrate layer have interior peripheries arranged in a step fashion stepping down toward the center of the multilayered wiring substrate. The central part of the upper substrate layer is thinner than the periphery. The surfaces and inside of the upper substrate layer are provided with conductive layers. The capacitor layer is a laminated body of two high dielectric layers formed of aluminum nitride with titanium nitride added thereto for raising the specific dielectric constant. Conductive layers are also formed on both surfaces of the capacitor layer and on the interface between the high dielectric layers. The lower substrate layer is also a laminated body of two aluminum nitride layers.

14 Claims, 2 Drawing Sheets

METHOD OF MANUFACTURING A MULTILAYERED WIRING SUBSTRATE OF ALUMINUM NITRIDE HAVING A HIGH DIELECTRIC LAYER

This is a divisional of application Ser. No. 08/285,294 filed Aug. 3, 1994.

FIELD OF THE INVENTION

This invention relates to a multilayered wiring substrate which can accommodate the speed of operation of a very large-scale integrated circuit and can effectively remove electric noise. In particular, the invention relates to an aluminum nitride multilayered wiring substrate having a high dielectric layer and a method of manufacture thereof, in which when a capacitor is provided in the multilayered wiring substrate, high capacitance can be easily obtained.

BACKGROUND OF THE INVENTION

The minituarization and enhanced function of electronic equipment are increasingly in demand. Semiconductors with a high integration density, have been rapidly developed to perform various functions, operate at high speed and produce high output. As a result, the amount of heat generated from semiconductors is increased. Therefore, semiconductor substrates must be composed of a material having high thermal conductivity. The material conventionally used is an aluminum oxide substrate, however, aluminum oxide has a low thermal conductivity of about 20 w/m·k. Furthermore, since the aluminum oxide substrate has a thermal expansion coefficient larger than that of silicon, it cannot be firmly joined with silicon semiconductors. Presently, aluminum nitride, which has a thermal conductivity larger than that of aluminum oxide and a thermal expansion coefficient close to that of silicon, has become a noteworthy material as a base material for semiconductor substrates.

Furthermore, since a very large-scale integrated circuit is operated at high speeds or frequencies, to effectively eliminate electric noise, capacitors must be provided on the semiconductor substrate. If chip capacitors are provided outside the semiconductor substrate, however, the inductance in the wiring is unfavorably increased. Alternatively, capacitors can be provided inside the semiconductor substrate. The semiconductor substrate is normally prepared by collectively sintering a ceramic layer and a wiring conductor. To obtain a specified capacitance by providing capacitors inside the normal substrate, dielectric layer sheets or paste having the same composition as that of the ceramic layer need to be laminated together with conductive layers, thereby forming a multilayered substrate. Consequently, when capacitors are provided inside the semiconductor substrate, the structure of the semiconductor substrate becomes complicated, thereby raising manufacturing costs.

To simplify the structure of the substrate, the dielectric layer is made thin to increase the capacitance, and the number of laminate layers is reduced. If the dielectric layer is thin, however, pin holes are easily formed and, as a result, an electric short can easily developed. Additionally, to attain good workability, the dielectric layer must be at least 10 μm thick, thereby restricting the resulting capacitance. Alternatively, the dielectric layer can be made larger in area, to obtain the specified capacitance. This is, however, undesirable due to the restrictions in the substrate design.

SUMMARY OF THE INVENTION

Wherefore, an object of this invention is to provide a multilayered wiring substrate of aluminum nitride having a high dielectric layer which can easily obtain high capacitance while obviating a large number of layers and to provide a method of manufacturing the multilayered wiring substrate.

To attain this and other objects, the invention provides a multilayered wiring substrate of aluminum nitride having a high dielectric layer. The high dielectric layer provided in the multilayered wiring substrate of aluminum nitride is mainly composed of a base component of aluminum nitride (between about 50% to about 94.9% by weight), a sintering aid for the aluminum nitride, and at least one element from group IVb and Vb of the Chemical Abstract Service version of the periodic table, chromium, or a nitride or a carbide of such elements.

The invention also provides a method of manufacturing a multilayered wiring substrate of aluminum nitride having a high dielectric layer. The method comprises the steps of blending the following components: 1) aluminum nitride; 2) a sintering aid for the aluminum nitride; and, 3) at least one element from group IVb or Vb or chromium, or a nitride or a carbide of such elements. The blended materials are then molded into a high dielectric layer crude sheet. A laminate sheet is made from the high dielectric layer crude sheet and a substrate crude sheet. The laminate sheet is degreased and then sintered.

In the invention, the first component is aluminum nitride as the base component of the multilayered wiring substrate and of the high dielectric layer. The powder of aluminum nitride has an average particle size of 10 μm or less, preferably of 2 μm or less. To obtain high thermal conductivity, it is preferable to have a material with a low impure oxygen content.

The second component of the high dielectric layer is the sintering aid for the aluminum nitride. Such component may be, for example, yttrium oxide, $Y_2O_3$—$Al_2O_3$ system compound, $Y_2O_3$—$Al_2O_3$ system compound, $Y_2O_3$—CaO or other similar compounds. The amount of sintering aid added is preferably between 0.1% and 10% by weight. The average particle size of the sintering aid is 10 μm or less, preferably 5 μm or less. Furthermore, an alkaline earth oxide or a rare earth oxide can be used as the sintering aid.

The third component (constituent) of the high dielectric layer is an element from group IVb or Vb or chromium, or a nitride or a carbide of such elements. To increase the specific dielectric constant, 5 to 40% by weight of the third component is added to the high dielectric layer. To maintain the superior electric characteristic and prevent an electric short from being caused by dispersed powder, the average particle size of the third component powder is preferably 5 μm or less. If less than 5% by weight of the third component is added, the specific dielectric constant cannot be sufficiently increased. If more than 40% by weight of the third component is added, an electric short can occur.

The formation of the high dielectric layer is almost identical to the formation of the substrate layers. Specifically, the powdered material is wet-blended using an organic solvent. An organic binder is then added to the blended material. Subsequently, in a doctor blade process, green sheets, for example, are prepared as the crude base material of the substrate and of the high dielectric layers. Subsequently, conductive layers and via-holes are made on and in the green sheets. The via-holes are then filled with a conductive paste.

The conductive layer is composed of at least one of of tungsten molybdenum or an other high-melting temperature metal. Alternatively, the conductive layer is composed of the high-melting temperature metal as the base component and at least one of nickel, cobalt or an other active or conductive metal added thereto. The conductive layer is formed by a metalizing paste (conductive paste) composed of the conductive layer material and the organic binder and by printing or applying the metalizing paste onto the green sheets.

The laminate sheet is formed by laminating a plurality of green sheets already formed with the conductive layer. The laminate sheet is heated in a nitrogen, an ammonia forming gas or an other similar atmosphere and is degreased to remove the organic binder. The ammonia forming gas is a mixture gas of nitride and hydrogen having a mixture rate of $N_2:H_2=1:3$ resulting from the decomposition of the ammonia which have been introduced into a high temperature furnace.

During a sintering process, the laminate sheet is placed in a container of aluminum nitride, boron nitride, carbon or an other similar compound, and is sintered in a non-oxidizing atmosphere containing argon, helium, nitrogen, carbon monoxide, hydrogen or an other suitable gas or a mixture consisting of such gases. Alternatively, the laminate sheet can be sintered in a vacuum. However, a sintering atmosphere containing nitrogen gas is the most desirable.

The sintering temperature of the laminate sheet is in the range of between 1600° C. and 2100° C., preferably between 1650° C. and 1800° C. If the sintering temperature is lower than 1600° C., the laminate sheet is insufficiently sintered. If the sintering temperature is greater than 2100° C., the aluminum nitride is vapored. The sintering process can be a normal pressure sintering, a hot pressing sintering or a pressurized sintering.

According to the invention, the high dielectric layer of the multilayered wiring substrate of aluminum nitride is mainly composed of aluminum nitride, the sintering aid, and a group IVb or Vb element or chromium, or a nitride or a carbide of such elements. In this composition, the high thermal conductivity of aluminum nitride is maintained, and the specific dielectric constant of the high dielectric layer can be increased. Consequently, high capacitance can be attained without making the dielectric layer excessively multilayered or thin-layered.

According to the method of manufacturing the aluminum nitride multilayered wiring substrate having the high dielectric layer, the aluminum nitride, the sintering aid and at least one element from group IVb or Vb or chromium, or a nitride or carbide of such elements are blended together. The blended material is molded into, for example, a green sheet as the high dielectric layer crude sheet. The dielectric layer crude sheet is laminated over the substrate crude sheets. The laminate sheet is degreased and sintered. Thus, the aluminum nitride multilayered wiring substrate having the high dielectric layer of high capacitance can be easily manufactured.

BRIEF DESCRIPTION OF THE DRAWINGS

The invention will now be described, by way of example, with reference to the accompanying drawings, in which.

DETAILED DESCRIPTION OF THE PREFERRED EMBODIMENTS

Figure 1:
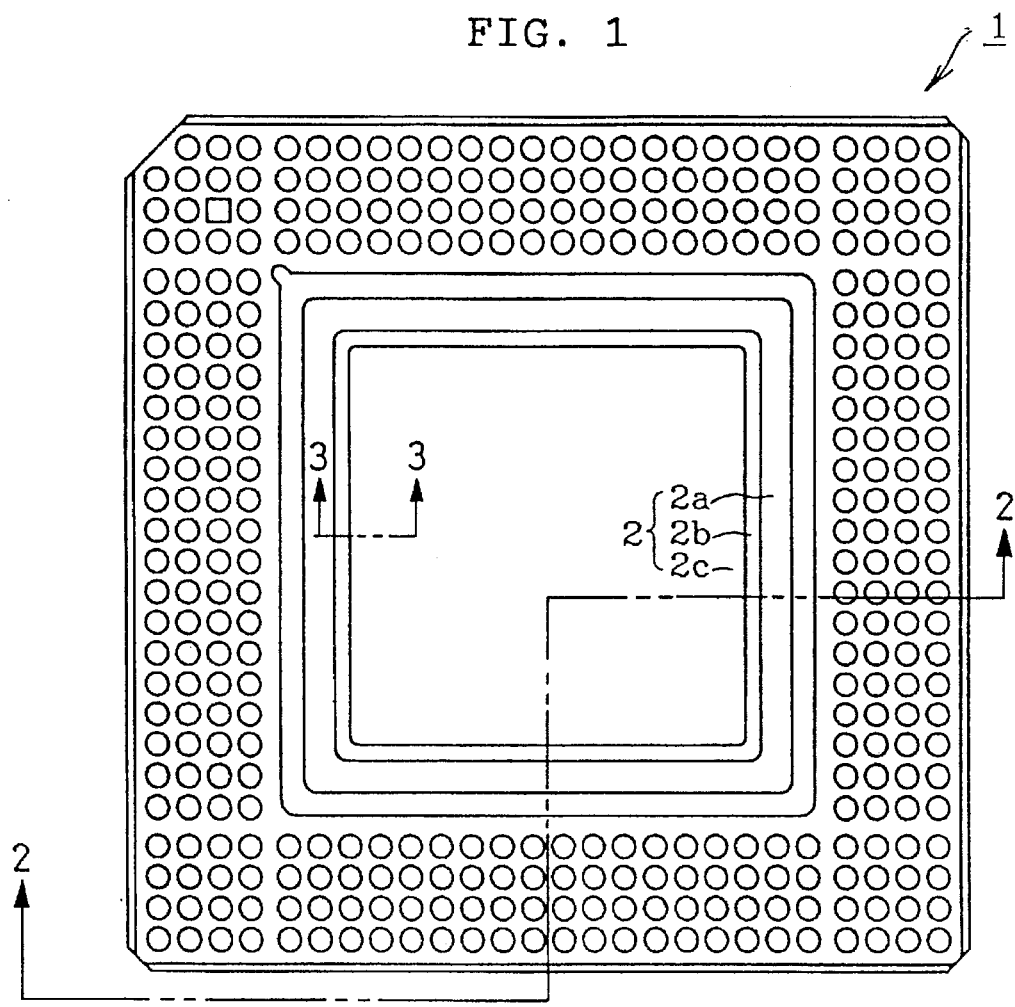
FIG. 1 is a plan view of a multilayered wiring substrate embodying the invention.
Figure 2:
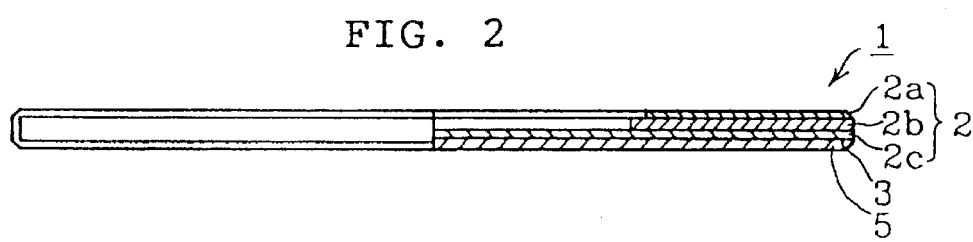
FIG. 2 is a partial cross-sectional view of the multilayered wiring substrate shown in FIG. 1 taken along line 2—2.
Figure 3:
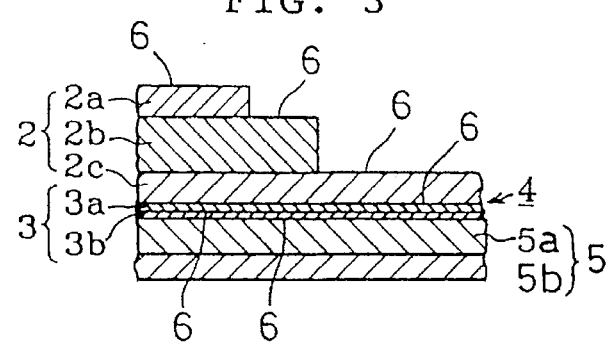
FIG. 3 is an enlarged fragmented cross-sectional view of the portion of the multilayered wiring substrate shown in FIG. 1.

As shown in FIGS. 1–3, a multilayered wiring substrate 1 of aluminum nitride bears 351 pins. The multilayered wiring substrate 1 is 75 mm long and wide, 3.7 mm thick, and is the laminated body of a 2.1 mm thick upper substrate layer 2, a 0.1 mm thick capacitor layer 4 and a 1.5 mm thick lower substrate layer 5.

The upper substrate layer 2 is a laminated body of three substrate layers 2a, 2b, 2c of aluminum nitride (FIG. 3). The periphery of the laminated layers 2a, 2b and 2c are arranged in the form of steps stepping down toward a center, such that a central part of the layer 2 is thin. The surface and inside of layers 2a, 2b and 2c are provided with conductor layers 6. The capacitor layer 4 is equivalent to the layer 3 and consists of two high dielectric layers 3a and 3b. The layer 3 is composed of aluminum nitride with titanium nitride added therein for raising the specific dielectric constant. The surfaces of capacitor layer 4, including the surfaces of the high dielectric layers 3a, 3b, have a conductive layer 6 formed thereon. The lower substrate layer 5 is a laminated body of two substrate layers of aluminum nitride 5a and 5b.

The manufacture of the multilayered wiring substrate 1 will now be explained in detail.

The material of the upper and lower substrate layers 2, is prepared. First, 95% by weight of aluminum nitride powder having an average particle size of 2 μm or less is wet-blended using an organic solvent, with the sintering aid comprising 5% by weight of yttrium oxide powder having an average particle size of 5 μm or less. An organic binder is then added thereto. Three green sheets of different thickness are prepared in a doctor blade process. Subsequently, during the crude processing, via-holes and other structural elements are made in the substrate green sheets.

The high dielectric layer 3 is prepared in the same manner as the upper and lower substrate layers 2 and 5. First, 80% by weight of aluminum nitride powder having an average particle size of 2 μm or less is wet-blended using an organic solvent, with the sintering aid comprising 5% by weight of yttrium oxide powder having an average particle size of 5 μm or less, and with the third component (constituent) comprising 15% by weight of titanium nitride powder having an average particle size of 2 μm or less. An organic binder is added thereto. In the doctor blade process, a 0.05 mm thick green sheet is prepared as the high dielectric sheet. Subsequently, via-holes and other structural elements are made in the high dielectric green sheet.

To form a metalizing paste as the material of the conductive layers, 95% by weight of tungsten powder as the high-melting temperature metal having an average particle size of 2 μm or less, 4.5% by weight of aluminum nitride powder having an average particle size of 2 μm or less and the sintering aid comprising 0.5% by weight of yttrium oxide powder having an average particle size of 5 μm or less are blended, with an organic binder added thereto. The metalizing paste is applied to the via-holes of the substrate and high dielectric green sheets, and is printed or applied onto the surfaces of the sheets so that the conductive layers 6 are formed.

Subsequently, the substrate and high dielectric green sheets are laminated over one another, thereby forming a green laminate sheet.

The green laminate sheet is heated in the atmosphere of nitrogen, ammonia forming gas or an other degreasing gas so as to remove the organic binder from the surfaces of the green laminate sheet.

The degreased green laminate sheet is then placed in a container of aluminum nitride, and is sintered at 1750° C. in a nitrogen atmosphere at normal (atmospheric) pressure for six hours. In this way, the aluminum nitride multilayered wiring substrate 1 having the high dielectric layer 3 is formed.

In the embodiment, the capacitance of the capacitor layer 4 of the multilayered wiring substrate 1 was measured to be 36 nF, which is a favorably high value. The capacitance of the capacitor layer of a conventional multilayered wiring substrate, the reference test piece No. 1 containing no third component as explained later, was measured to be 22 nF, which is an unfavorably low value. Consequently, the multilayered wiring substrate of the embodiment, which has the same thickness as that of a conventional substrate, can attain a higher capacitance. In the embodiment, the number of laminated layers required for providing the specified capacitance can be advantageously minimized. The manufacture of the multilayered wiring substrate having a high dielectric layer can be easily performed and, as a result, the manufacturing cost can be reduced.

The experiments which were conducted to demonstrate the effectiveness of the invention will now be explained. In the experiments, models of the multilayered wiring substrate were prepared for the purpose of comparison. Various values of capacitance were measured and recorded.

utilized in the doctor blade process to from 0.6 mm thick green sheets. Four such green sheets were laminated together to form one laminate sheet of 2.4 mm in thickness. The laminate sheet was cut into test pieces. The test pieces were degreased in an ammonia forming gas, placed in a container of aluminum nitride, and sintered in a nitrogen atmosphere for six hours. Thereafter, the surfaces of the test pieces were then polished. Consequently, the 0.635 mm thick high dielectric test pieces were prepared, corresponding to embodiment test pieces No. 1–9.

The following five measurements were taken from the high dielectric pieces and also from the reference test pieces No. 1–4. These reference test pieces are outside the scope of the invention. The results are shown in Table 1.

1. Density—measured in water according to Archimedes' principle;

2. Coefficient of thermal conductivity—using the laser flash process;

3. Volume resistivity—using tetra-ohm, 500 V;

4. Voltage withstand—measured in an insulating oil using an alternating voltage of 60 Hz; and 5. Specific dielectric constant, dielectric loss—using an impedance analyzer calculated based on the capacitance at 10 MHz

TABLE 1

| TEST PIECE NO. | SINTERING AID [% BY WEIGHT] | ADDITIVE [% BY WEIGHT] | BURNING DENSITY [g/cm$^3$] | THERMAL CONDUCTIVITY [W/m·k] | VOLUME RESISTIVITY [Ω·cm] | VOLTAGE WITHSTAND [KV/mm] (IN OIL) | SPECIFIC DIELECTRIC CONSTANT (10 MHz) | DIELECTRIC LOSS [× 10$^{-3}$] (10 MHz) | COMPONENT PHASE EXCEPT AlN |
|---|---|---|---|---|---|---|---|---|---|
| EMBODIMENT | | | | | | | | | |
| 1 | Y$_2$O$_3$; 5 | TiN; 5 | 3.40 | 182 | >10$^{14}$ | 17.0 | 10.1 | 4.5 | YAL, YAG, TiN |
| 2 | ↑ | TiN; 10 | 3.45 | 169 | >10$^{14}$ | 13.4 | 11.3 | 4.6 | YAL, YAG, TiN |
| 3 | ↑ | TiN; 15 | 3.48 | 155 | >10$^{14}$ | 9.0 | 14.2 | 3.7 | YAL, YAG, TiN |
| 4 | ↑ | TiN; 20 | 3.53 | 130 | >10$^{14}$ | 4.5 | 17.8 | 4.3 | YAL, YAG, TiN |
| 5 | ↑ | VN; 20 | 3.51 | 125 | >10$^{14}$ | 10.9 | 13.8 | 3.8 | YAG, VN |
| 6 | ↑ | NbN; 20 | 3.72 | 132 | 3 × 10$^{13}$ | 15.7 | 12.7 | 5.2 | YAL, YAG, etc. |
| 7 | ↑ | TiN; 5 VN; 10 | 3.49 | 152 | >10$^{14}$ | 12.0 | 14.0 | 4.2 | YAL, YAG, TiN, VN |
| REFERENCE | | | | | | | | | |
| 1 | Y$_2$O$_3$; 5 | — | 3.32 | 195 | >10$^{14}$ | 20.0 | 8.9 | 3.8 | YAL, YAG |
| 2 | ↑ | TiO$_2$; 5 | 3.44 | 72 | >10$^{14}$ | 17.0 | 10.8 | 4.7 | YAL, YAG, TiN |
| 3 | ↑ | SiC; 10 | 3.31 | 52 | >10$^{14}$ | 18.2 | 8.9 | 5.7 | |
| 4 | ↑ | SiC; 20 | 3.27 | 39 | 2 × 10$^{13}$ | 11.9 | 15.0 | 3.5 | |

YAL = YAlO$_3$, YAG = Y$_3$Al$_5$O$_{12}$

EXPERIMENT 1

In Experiment 1, only the high dielectric layer as the capacitor was prepared and the characteristics of the layer were examined.

First, 90 to 55% by weight of aluminum nitride powder having an average particle size of 1.2 μm, 5% by weight of yttrium oxide powder as the sintering aid having an average particle size of 1.4 μm and 5 to 40% by weight of the third component for providing high capacitance having an average particle size between 0.6 μm and 1.8 μm were blended together in an organic solvent. The third component, corresponding to the additives shown in Table 1, is an element from group IVb or Vb or chromium, a nitride or a carbide of such elements. An organic binder was added to the blended components thereby preparing a slurry, The slurry was As clearly shown in Table 1, the embodiment test pieces No. 1–9 have the thermal conductivity larger than 125 W/m·k and the specific dielectric constant of 10.1 or larger. These values are sufficient so that the formed dielectric layer is appropriate for use in a multilayered substrate for a very large-scale integrated circuit. As shown in the ADDITIVE column of Table 1 (which corresponds to the amount of third component added), the embodiment test pieces contain 5 to 40% by weight of titanium nitride, vanadium nitride, or other third components. The greater the amount of the third component added, the higher the specific dielectric constant becomes. If the amount of additive is increased, however, the voltage withstand property tends to be impaired. If the amount of additive of titanium nitride, vanadium nitride or an other nitride is increased, the thermal conductivity is decreased.

The reference test piece No. 1, which contains no third component, has an undesirably low specific dielectric constant of 8.9, although it has a high thermal conductivity. The reference test piece No. 2 has an undesirably low thermal conductivity of 72 W/m·k, although it has a high specific dielectric constant of 10.8. The reference test piece No. 3 has both an undesirably low thermal conductivity and specific dielectric constant. The reference test piece No. 4 has an undesirably low thermal conductivity of 39 W/m·k, although it has a high specific dielectric constant of 15.

EXPERIMENT 2

Figure 4:
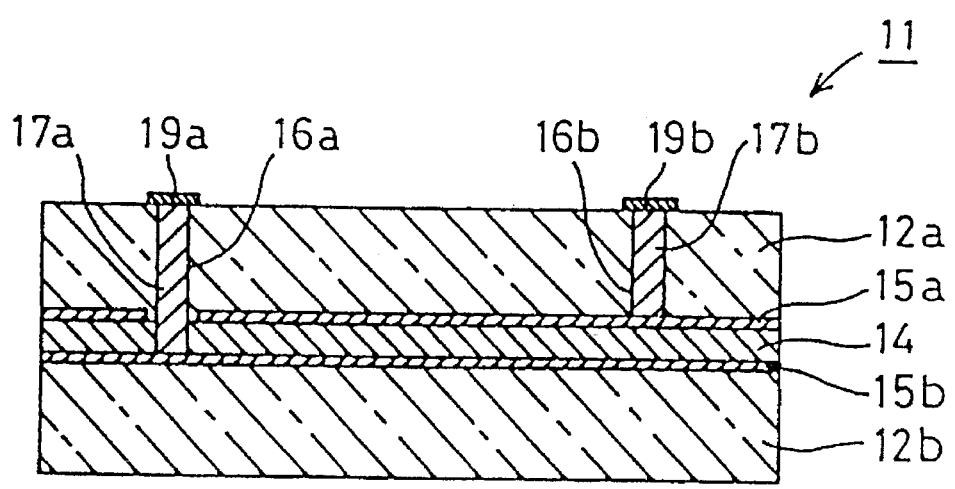
FIG. 4 is a cross-sectional view showing the structure of a capacitor for use in an experiment.

In Experiment 2, a capacitor model shown in FIG. 4, was prepared for measurement. As shown in FIG. 4, a capacitor 11 is composed of upper and lower substrate layers 12a, 12b of aluminum nitride. A high dielectric layer 14 is disposed between the upper and lower substrate layers 12a and 12b. Metalizing (conductive) layers 15a and 15b of tungsten are formed on both surfaces of the high dielectric layer 14, and are connected to conductor layers 17a, 17b of tungsten filled in via-holes 16a and 16b. The conductor layers 17a and 17b are respectively connected to electrode layers 19a and 19b of tungsten.

The manufacture of capacitor 11 is now explained.

Using the additive shown in Table 2 as the third component, in the same way as aforementioned with respect to Experiment 1, high dielectric and substrate green sheets were prepared. Via-holes were made in specified positions of the green sheets. The metalizing paste mainly composed of tungsten or an other high-melting temperature metal is applied to the via-holes, and is printed or applied onto specified positions of the upper and lower surfaces of the high dielectric sheet to form metalizing layers. The green sheets are laminated together such that the high dielectric sheet is disposed between the upper and lower substrate sheets. The tungsten paste is printed onto specified positions of the upper substrate layer sheet, thereby forming the electrode layer having an area of about 6 cm². The laminated body of green sheets is degreased in an ammonia forming gas, placed in a container of aluminum nitride, and sintered at 1750° C. in a nitrogen atmosphere for six hours.

The capacitance of the embodiment test pieces No. 10–13 for capacitor 11 were measured using an impedance analyzer. The thickness of high dielectric layer 14 was measured from the cross sections of the test pieces No. 10–13. Based upon the thickness, the specific dielectric constant was calculated. Using a scanning electron microscope, the reaction between the metalizing layers 15, 16 and the high dielectric layer 14 was examined. The results are shown in Table 2.

higher than 10.8. In Experiment 2, the specific dielectric constants are slightly higher than those in Experiment 1 in which only the high dielectric layer was prepared.

This invention has been described above with reference to the preferred embodiments as shown in the figures. Modifications and alterations may become apparent to one skilled in the art upon reading and understanding the specification. Despite the use of the embodiments for illustration purposes, the invention is intended to include all such modifications and alterations within the spirit and scope of the appended claims.

What is claimed is:

1. A method of manufacturing a multilayered wiring substrate of aluminum nitride having a high dielectric layer, said method comprising the steps of:

(a) forming a slurry of aluminum nitride, a sintering aid, and at least one constituent for increasing a dielectric constant of a high dielectric layer, said at least one constituent comprising at least one element selected from the group consisting of a group IVb element, a group Vb element, chromium, a nitride of such elements, and a carbide of such elements;

(b) forming a high dielectric layer crude material sheet from said slurry;

(c) forming a substrate crude material sheet;

(d) combining said high dielectric crude material sheet with said substrate crude material sheet to form a laminated body;

(e) degreasing said laminated body; and (f) sintering said laminated body.

2. The method according to claim 1 wherein the step of forming said slurry comprises the step of blending, in an organic solvent, about 50% to about 94.9% by weight of said aluminum nitride having an average particle size less than 10 μm, about 0.1% to about 10% by weight of said sintering aid having an average particle size less than 10 μm, and about 5% to about 40% by weight of said at least one constituent having an average particle size of about 5 μm.

3. The method according to claim 2, wherein said aluminum nitride has an average particle size less than 2 μm, said sintering aid has an average particle size less than 5 μm, and said at least one constituent has an average particle size of less than 5 μm.

4. The method according to claim 1 wherein the step of forming said slurry further comprises the step of adding an organic binder to said slurry.

5. The method according to claim 4 wherein said degreasing step comprises the step of heating said laminated body in an atmosphere of one of nitrogen and an ammonia forming gas to remove the organic binder.

TABLE 2

| TEST PIECE NO. | ADDITIVE [% BY WEIGHT] | CAPACITANCE [nF] | SPECIFIC DIELECTRIC CONSTANT | THICKNESS OF HIGH DIELECTRIC LAYER [mm] | REACTION WITH METALIZING LAYERS |
|---|---|---|---|---|---|
| EMBODIMENT | | | | | |
| 10 | TiN; 15 | 1.54 | 14.5 | 0.05 | NIL |
| 11 | VN; 30 | 1.52 | 14.3 | ↑ | ↑ |

As clearly shown in Table 2, the embodiment test pieces 10–13 contain the specified amount of additive of third component as the high dielectric layer component. Therefore, the specific dielectric constants are favorably 6. The method according to claim 1 further comprising the step of using an oxide selected from the group consisting of $Y_2O_3$, $Y_2O_3$—$Al_2O_3$, $Y_2O_3$—CaO—$Al_2O_3$, $Y_2O_3$—CaO, an alkaline earth oxide and a rare earth oxide as said sintering aid.

7. The method according to claim 1 further comprising the steps of:
   (a) forming via-holes and other structural elements on at least one of said crude material sheets;
   (b) forming a conductive layer on at least one of said crude material sheets; and
   (c) applying a conductive paste to said formed via-holes and other structural elements of at least one of said crude material sheets.

8. The method according to claim 7 wherein the step of forming the conductive layer comprises applying a high-melting temperature metal to a desired surface of at least one of said crude material sheets.

9. The method according to claim 8, wherein said conductive layer includes at least one of tungsten and molybdenum.

10. The method according to claim 9, wherein said conductive layer further includes at least one of nickel and cobalt.

11. The method according to claim 8 wherein the step of forming the conductive layer further comprises
   (a) adding an organic binder to said high-melting temperature metal to form a conductive paste, and
   (b) applying said conductive paste to a desired portion of at least one of said crude material sheets.

12. The method according to claim 1 wherein said sintering step comprises the steps of:
   (a) placing said laminated body in a container of one of aluminum nitride, boron nitride, and carbon; and
   (b) sintering said laminated body in a non-oxidizing atmosphere at a temperature between about 1600° C. to about 2100° C.

13. The method according to claim 12 further comprising the step of sintering said laminated body in the non-oxidizing atmosphere at a temperature between about 1650° C. to about 1800° C.

14. The method according to claim 12 further comprising the step of using at least one of argon, helium, nitrogen, carbon monoxide, and hydrogen as the non-oxidizing atmosphere.

* * * * *